(12) United States Patent
Sasaki et al.

(10) Patent No.: US 12,113,326 B2
(45) Date of Patent: Oct. 8, 2024

(54) LASER DEVICE AND ELECTRONIC DEVICE MANUFACTURING METHOD

(71) Applicant: Gigaphoton Inc., Tochigi (JP)

(72) Inventors: Yoichi Sasaki, Oyama (JP); Kouji Kakizaki, Oyama (JP); Hakaru Mizoguchi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 272 days.

(21) Appl. No.: 17/817,839

(22) Filed: Aug. 5, 2022

(65) Prior Publication Data

US 2022/0376455 A1    Nov. 24, 2022

Related U.S. Application Data

(63) Continuation of application No. PCT/JP2020/012174, filed on Mar. 19, 2020.

(51) Int. Cl.
  *H01S 3/036*  (2006.01)
  *G03F 7/20*  (2006.01)
  *H01S 3/038*  (2006.01)

(52) U.S. Cl.
  CPC ............ *H01S 3/036* (2013.01); *G03F 7/2006* (2013.01); *H01S 3/038* (2013.01)

(58) Field of Classification Search
  CPC .... G03F 7/2006; G03F 7/70025; H01S 3/036; H01S 3/038; H01S 3/225; H01S 3/2256
  See application file for complete search history.

(56) References Cited

U.S. PATENT DOCUMENTS

| 5,991,324 A | 11/1999 | Knowles et al. |
| 6,414,979 B2 * | 7/2002 | Ujazdowski ........ G03F 7/70025 |
| | | 372/87 |
| 6,914,919 B2 | 7/2005 | Watson et al. |

(Continued)

FOREIGN PATENT DOCUMENTS

| JP | 2000-058944 A | 2/2000 |
| JP | 2000-114623 A | 4/2000 |

(Continued)

OTHER PUBLICATIONS

International Search Report issued in PCT/JP2020/012174; mailed Jun. 23, 2020.

(Continued)

*Primary Examiner* — Deoram Persaud
(74) *Attorney, Agent, or Firm* — Studebaker & Brackett PC

(57) ABSTRACT

A laser device according to an aspect of the present disclosure includes a chamber into which laser gas is introduced; a pair of electrodes arranged in the chamber; a power source configured to apply a voltage between the electrodes; a nozzle structure which includes an internal passage for receiving the laser gas and a slit connected to the internal passage and is configured to generate flow of the laser gas between the electrodes due to the laser gas blowing out from the slit; a gas flow path which has a suction port through which the laser gas in the chamber is suctioned and introduces, to the nozzle structure, the laser gas suctioned through the suction port; and a blower device configured to cause the laser gas to blow toward the internal passage of the nozzle structure through the gas flow path.

20 Claims, 19 Drawing Sheets

(56) References Cited

U.S. PATENT DOCUMENTS

| | | | |
|---|---|---|---|
| 7,061,961 B2* | 6/2006 | Knowles | H01S 3/2366 |
| | | | 372/60 |
| 2014/0105237 A1* | 4/2014 | Hayashikawa | H01S 3/036 |
| | | | 372/58 |
| 2016/0111846 A1* | 4/2016 | Mochiyama | B23K 26/0643 |
| | | | 219/121.84 |
| 2016/0336706 A1* | 11/2016 | Hayashikawa | H01S 3/036 |
| 2017/0179668 A1* | 6/2017 | Krasnov | H01S 3/036 |
| 2017/0229831 A1 | 8/2017 | Hersman et al. | |
| 2023/0387642 A1* | 11/2023 | Fujimoto | H01S 3/03 |

FOREIGN PATENT DOCUMENTS

| | | |
|---|---|---|
| JP | 2006-156790 A | 6/2006 |
| JP | 2007-208183 A | 8/2007 |
| JP | 2008-004584 A | 1/2008 |
| JP | 2012-506515 A | 3/2012 |
| JP | 2014-146716 A | 8/2014 |
| WO | 2010/046691 A1 | 4/2010 |

OTHER PUBLICATIONS

International Preliminary Report on Patentability and Written Opinion issued in PCT/JP2020/012174; issued Sep. 20, 2022.

* cited by examiner

LASER DEVICE AND ELECTRONIC DEVICE MANUFACTURING METHOD

CROSS-REFERENCE TO RELATED APPLICATIONS

The present application claims the benefit of International Application No. PCT/JP2020/012174, filed on Mar. 19, 2020 the entire contents of which are hereby incorporated by reference.

BACKGROUND

1. Technical Field

The present disclosure relates to a laser device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device have a large spectral line width of about 350 to 400 pm in natural oscillation light. Therefore, when a projection lens is formed of a material through which ultraviolet rays such as KrF laser light and ArF laser light are transmitted, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. In the following, a gas laser device with a narrowed spectral line width is referred to as a line narrowing gas laser device.

LIST OF DOCUMENTS

Patent Documents

Patent Document 1: U.S. Pat. No. 6,914,919
Patent Document 2: Japanese Patent Application Publication No. 2007-208183

SUMMARY

A laser device according to an aspect of the present disclosure includes a chamber into which laser gas is introduced; a pair of electrodes arranged in the chamber; a power source configured to apply a voltage between the electrodes; a nozzle structure which includes an internal passage for receiving the laser gas and a slit connected to the internal passage and is configured to generate flow of the laser gas between the electrodes due to the laser gas blowing out from the slit; a gas flow path which has a suction port through which the laser gas in the chamber is suctioned and introduces, to the nozzle structure, the laser gas suctioned through the suction port; and a blower device configured to cause the laser gas to blow toward the internal passage of the nozzle structure through the gas flow path.

An electronic device manufacturing method according to another aspect of the present disclosure includes generating laser light using a laser device, outputting the laser light to an exposure apparatus, and exposing a photosensitive substrate to the laser light in the exposure apparatus to manufacture an electronic device. Here, the laser device includes a chamber into which the laser gas is introduced; a pair of electrodes arranged in the chamber; a power source configured to apply a voltage between the electrodes; a nozzle structure which includes an internal passage for receiving the laser gas and a slit connected to the internal passage and is configured to generate flow of the laser gas between the electrodes due to the laser gas blowing out from the slit; a gas flow path which has a suction port through which the laser gas in the chamber is suctioned and introduces, to the nozzle structure, the laser gas suctioned through the suction port; and a blower device configured to cause the laser gas to blow toward the internal passage of the nozzle structure through the gas flow path.

BRIEF DESCRIPTION OF THE DRAWINGS

Embodiments of the present disclosure will be described below merely as examples with reference to the accompanying drawings.

DESCRIPTION OF EMBODIMENTS

Figure 1:
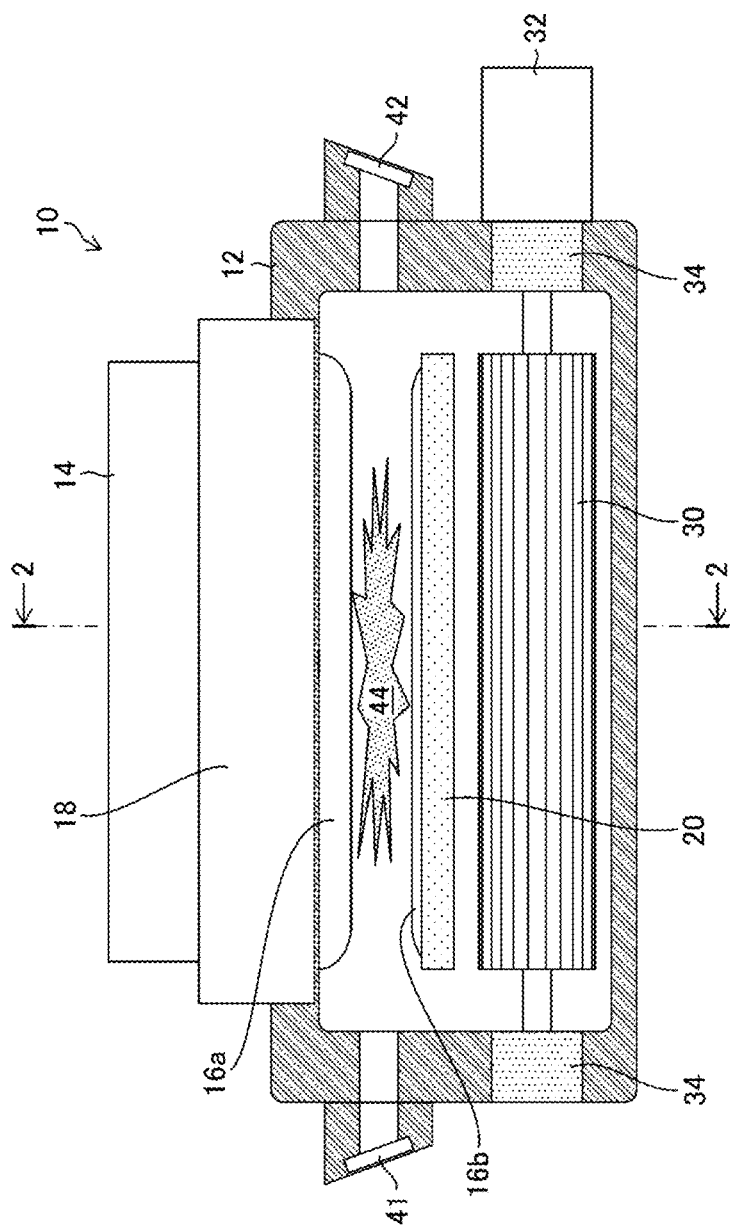
FIG. 1 schematically shows a configuration example of a laser device according to a comparative example.

<Contents>
1. Overview of Laser Device According to Comparative Example
   1.1 Configuration
   1.2 Operation
   1.3 Problem
2. First embodiment
   2.1 Configuration
      2.1.1 Overall configuration
      2.1.2 Configuration of discharge unit and ring
   2.2 Operation
      2.2.1 Operation principle of ring
      2.2.2 Specific numerical example
   2.3 Effect
3. Second embodiment
   3.1 Configuration
   3.2 Operation
   3.3 Effect
4. Third embodiment
   4.1 Configuration
   4.2 Operation
   4.3 Effect
5. Fourth embodiment
   5.1 Configuration
   5.2 Operation
   5.3 Effect
   5.4 Modification
6. Fifth embodiment
   6.1 Configuration
   6.2 Operation
   6.3 Effect
   6.4 Modification
7. Sixth embodiment
   7.1 Configuration
   7.2 Operation
   7.3 Effect
8. Electronic device manufacturing method
9. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview of Laser Device According to Comparative Example 1.1 Configuration

Figure 2:
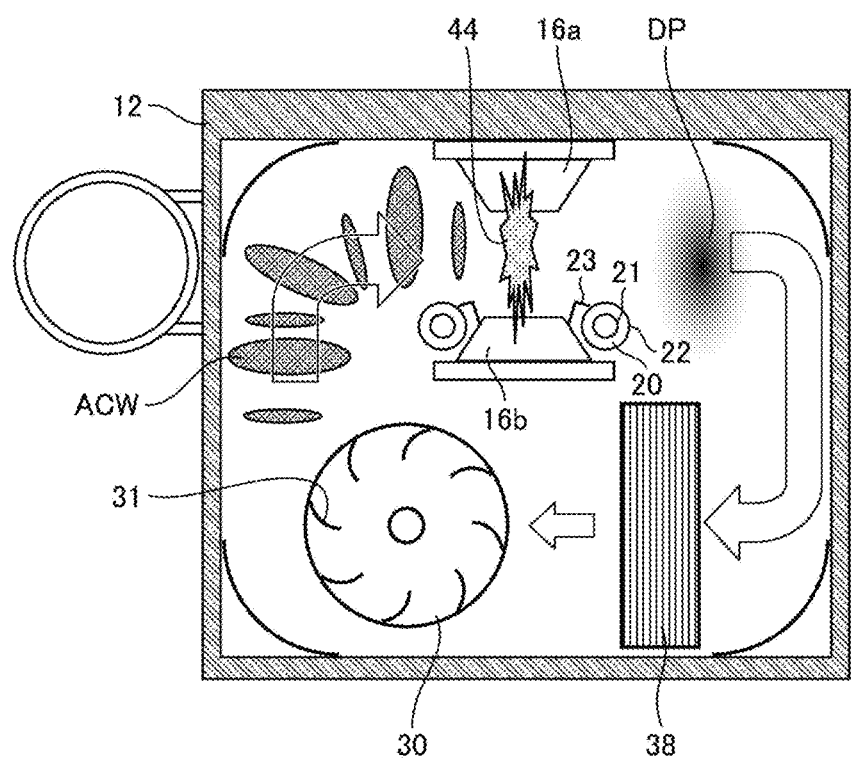
FIG. 2 is a sectional view of a chamber along line 2-2 shown in FIG. 1.

FIG. 1 schematically shows a configuration example of a laser device 10 according to a comparative example. FIG. 2 is a sectional view of a chamber 12 along line 2-2 shown in FIG. 1. The comparative example of the present disclosure is an example recognized by the applicant as known only by the applicant, and is not a publicly known example admitted by the applicant.

The laser device 10 includes the chamber 12 and a power source 14. The chamber 12 includes a pair of electrodes 16a, 16b, an electrically insulating member 18, a corona tube 20, a cross flow fan 30, a motor 32, a magnetic bearing 34, a radiator 38, and two windows 41, 42.

The chamber 12 is connected to a laser gas supply device (not shown) and a laser gas exhaust device (not shown). A laser gas is introduced into the chamber 12 via the laser gas supply device. The laser gas may include, for example, argon (Ar) or krypton (Kr) as rare gas, fluorine ($F_2$) as halogen gas, and neon (Ne), helium (He), or mixed gas thereof as buffer gas. The laser gas supply device includes a valve (not shown) and a flow rate control valve (not shown). The laser gas supply device is connected to a gas cylinder (not shown). The laser gas exhaust device may include a valve (not shown) and an exhaust pump (not shown).

The chamber 12 is arranged on the optical path of a laser resonator (not shown). The laser resonator includes, for example, a line narrowing module (LNM) and an output coupling mirror. The line narrowing module includes a grating, a prism, and a rotation stage for rotating the prism. The prism is arranged such that a beam of laser light output from the chamber 12 is expanded by the prism and is incident on the grating at a predetermined angle. The rotation stage is arranged such that the incident angle of the beam on the grating changes as the prism rotates. The grating is arranged in the Littrow arrangement in which the incident angle and the diffraction angle of the beam are the same.

The output coupling mirror may be a partial reflection mirror coated with a multilayer film which reflects a part of the laser light generated in the chamber 12 and through which another part thereof is transmitted. The chamber 12 is arranged such that a discharge region of the electrodes 16a, 16b is arranged on the optical path of the laser resonator. The electrode 16a is a cathode electrode, and the electrode 16b is an anode electrode.

The power source 14 may be, for example, a pulse power module (PPM). The power source 14 is connected to the electrode 16a via a feedthrough of the electrically insulating member 18. The electrode 16b is connected to the grounded chamber 12. The power source 14 includes a switch (not shown) for generating discharge 44 between the electrodes 16a, 16b, and a charging capacitor (not shown). The charging capacitor is connected to a charger (not shown). The switch and the charger are connected to a laser control device (not shown).

The corona tube 20 extends substantially parallel to the electrode 16b. The corona tube 20 includes a corona inner electrode 21 as a rod-shaped inner conductor, and a tubular external dielectric 22 covering the outer peripheral portion of the corona inner electrode 21. The corona inner electrode 21 is connected to a high-voltage side of a high-voltage power source (not shown). A corona outer electrode 23 is connected to the outside of the external dielectric 22. The external dielectric 22 has a ground potential via the corona outer electrode 23.

The motor 32 is a power source of the cross flow fan 30. A rotation shaft of the cross flow fan 30 is supported by the chamber 12 via the magnetic bearing 34.

1.2 Operation

The laser gas is circulated in the chamber 12 by the cross flow fan 30 arranged in the chamber 12.

The laser control unit receives various kinds of target data and a light emission trigger signal from a control device of an exposure apparatus (not shown). The target data includes, for example, target pulse energy Et, a target wavelength λt, target spectral line width Δλt, and the like. The charge voltage is set in the charger so that the pulse energy of the output laser light becomes the target pulse energy Et, and the switch in the power source 14 is operated in synchronization with the light emission trigger signal. By operating the switch, high voltages can be applied between the corona inner electrode 21 and the corona outer electrode 23 and between the electrodes 16a, 16b, respectively.

Accordingly, first, corona discharge occurs in a preionization discharge unit including the corona tube 20 and the corona outer electrode 23, and ultraviolet (UV) light is generated. When the laser gas between the electrodes 16a, 16b for the main discharge is irradiated with the generated UV light, the laser gas between the electrodes 16a, 16b can be pre-ionized. Thereafter, the discharge 44 is generated between the electrodes 16a, 16b, whereby the laser gas is excited. Light emitted from the excited laser gas reciprocates in the laser resonator formed by the output coupling mirror and the line narrowing module, thereby reaching laser oscillation. The laser light reciprocating in the laser resonator is narrowed by the prism and the grating, and a part thereof is output from the output coupling mirror. A discharge product DP containing metal dust is generated in the chamber 12 by the discharge 44.

In the present specification, a space between the electrodes 16a, 16b in which the discharge 44 occurs is referred to as a "discharge space", and a region around the electrodes 16a, 16b including the electrodes 16a, 16b and the discharge space is referred to as a "discharge portion." In addition, the description "between electrodes" in the present specification refers to between the electrodes 16a, 16b unless otherwise specified.

1.3 Problem

The laser device 10 according to the comparative example has the following problems.

[Problem 1]

Since a compressional wave (acoustic wave) generated by the discharge 44 is reflected by blades 31 of the cross flow fan 30 and returns to the discharge space to cause energy to be modulated, the energy stability is deteriorated.

[Problem 2]

The gas flow generated by the cross flow fan 30 is modulated according to the rotation of the blades 31. That is, the gas flow is not ideal continuous flow. The gas flow in the gas path from the cross flow fan 30 toward the discharge space in FIG. 2 is modulated according to the rotating blades 31. FIG. 2 shows an image of an acoustic wave ACW reflected by the blades 31.

[Problem 3]

The motor 32, the cross flow fan 30, and the magnetic bearing 34 are increasing in size in order to generate a gas flow throughout the chamber 12. Since these elements are rotated at high speed, vibration becomes large. Further, the cost is increased due to the increase in size of these elements.

2. First Embodiment 2.1 Configuration 2.1.1 Overall Configuration

Figure 3:
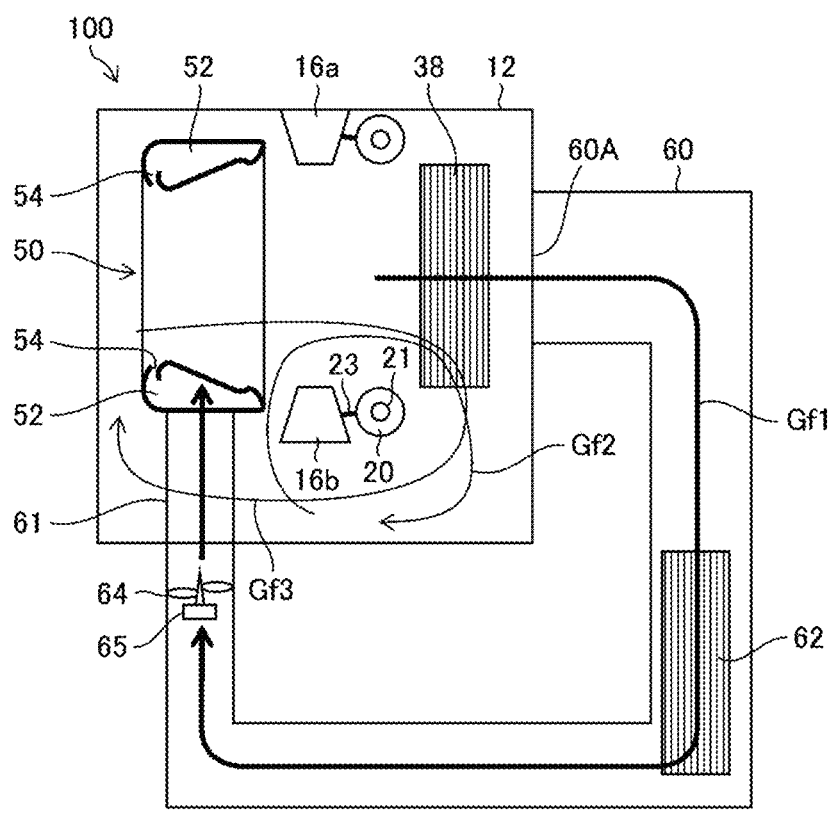
FIG. 3 schematically shows a configuration example of the laser device according to a first embodiment.

FIG. 3 schematically shows a configuration example of the laser device 100 according to a first embodiment. The configuration shown in FIG. 3 will be described on differences from the comparative example shown in FIGS. 1 and 2. In the laser device 100 shown in FIG. 3, in place of the cross flow fan 30, a slit-formed ring 50 that creates flow of the laser gas is arranged in the chamber 12. A specific structure example of the ring 50 will be described later with reference to FIGS. 4 and 5. Hereinafter, the laser gas may be simply referred to as "gas", and the flow of the laser gas may be referred to as "gas flow" or "air."

The ring 50 is a hollow ring-shaped (annular) structure having an internal passage 52 for receiving the gas and a slit 54 serving as a gas outlet. Here, "ring-shaped" refers to a shape grasped as a "closed figure." The "closed figure" may be referred to as a "closed curve." The ring 50 of the present example has a substantially rectangular shape in a front view. The ring 50 is a nozzle structure that receives the gas in a ring-shaped internal passage 52 and causes the gas to blow out from the ring-shaped slit 54. The cross-sectional shape of the ring 50 is a wing-like shape as a wing of an airplane.

The slit 54 is provided on the inner circumferential surface of the ring 50. The gas blows out from the slit 54 of the ring 50 in the right direction in FIG. 3, and gas flow is formed in the discharge space.

An arrow Gf1 in FIG. 3 represents the gas flow blowing out from the slit 54 of the ring 50. An arrow Gf2 represents the gas flow that does not pass through the ring 50 among the gas flow amplified by the gas blowing out from the slit 54. An arrow Gf3 represents the gas flow that passes through the ring 50 among the gas flow amplified by the gas blowing out from the slit 54.

The ring 50 is arranged on the upstream side of the discharge space with respect to the gas flow flowing in the discharge space. A gas flow path 60 is provided outside the chamber 12. Further, a gas flow path 61 communicating with the gas flow path 60 is arranged in the chamber 12. The gas flow path 61 is connected to the ring 50. The gas flow paths 60, 61 configure a gas circulation path for circulating the gas by returning the gas having passed through the discharge space to the internal passage 52 of the ring 50 again.

The gas flow path 60 has a suction port 60A serving as a gas suction port, and the suction port 60A is connected to the chamber 12. A dust filter 62 is arranged in the gas flow path 60. The dust filter 62 captures metal dust. Further, a fan 64 and a motor 65 are arranged in the gas flow path 60. The motor 65 is a power source for rotating the fan 64. By driving the motor 65 to rotate the fan 64, the pressure on the downstream side in the gas flow path 60 is increased, and a gas flow is generated. Rotation of the fan 64 causes the gas to blow toward the internal passage 52 of the ring 50.

The fan 64 and the motor 65 may be arranged outside the chamber 12. The motor 65 preferably has a structure not to be exposed to fluorine gas. Examples of another embodiment relating to the arrangement structure of the motor 65 will be described later with reference to FIGS. 9 and 10.

Further, the configuration for sending the gas toward the internal passage 52 of the ring 50 is not limited to the example using the fan 64 and the motor 65, and a compressor may be used as exemplified in FIG. 16 to be described later.

The radiator 38 is arranged in the path of the gas flow. The radiator 38 may be arranged anywhere in the gas flow path through which the gas circulates. For example, the radiator 38 is arranged in the chamber 12 as shown in FIG. 3. The radiator 38 shown in FIG. 3 is arranged in the gas flow path between the electrodes 16a, 16b and the suction port 60A of the gas flow path 60. Here, the radiator 38 may be arranged in the gas flow path 60.

Since the laser gas includes fluorine gas, the inner wall of the chamber 12 and members in contact with the laser gas, such as the gas flow paths 60, 61, are made using a fluorine-resistant material or subjected to a fluorine-resistant surface treatment. Examples of the fluorine-resistant material include nickel (Ni), stainless steel (SUS), and copper (Cu). Examples of the fluorine-resistant surface treatment include a fluorine passivation treatment such as electroless nickel plating.

Although the gas circulation path is configured by providing the gas flow path 60 outside the chamber 12 in FIG. 3, the present invention is not limited to this configuration, and it is also possible to configure the gas circulation path inside the chamber 12 so as to circulate the gas in the chamber 12. An example of configuring the gas circulation path inside the chamber 12 will be described later with reference to FIG. 8.

2.1.2 Configuration of Discharge Unit and Ring

Figure 4:
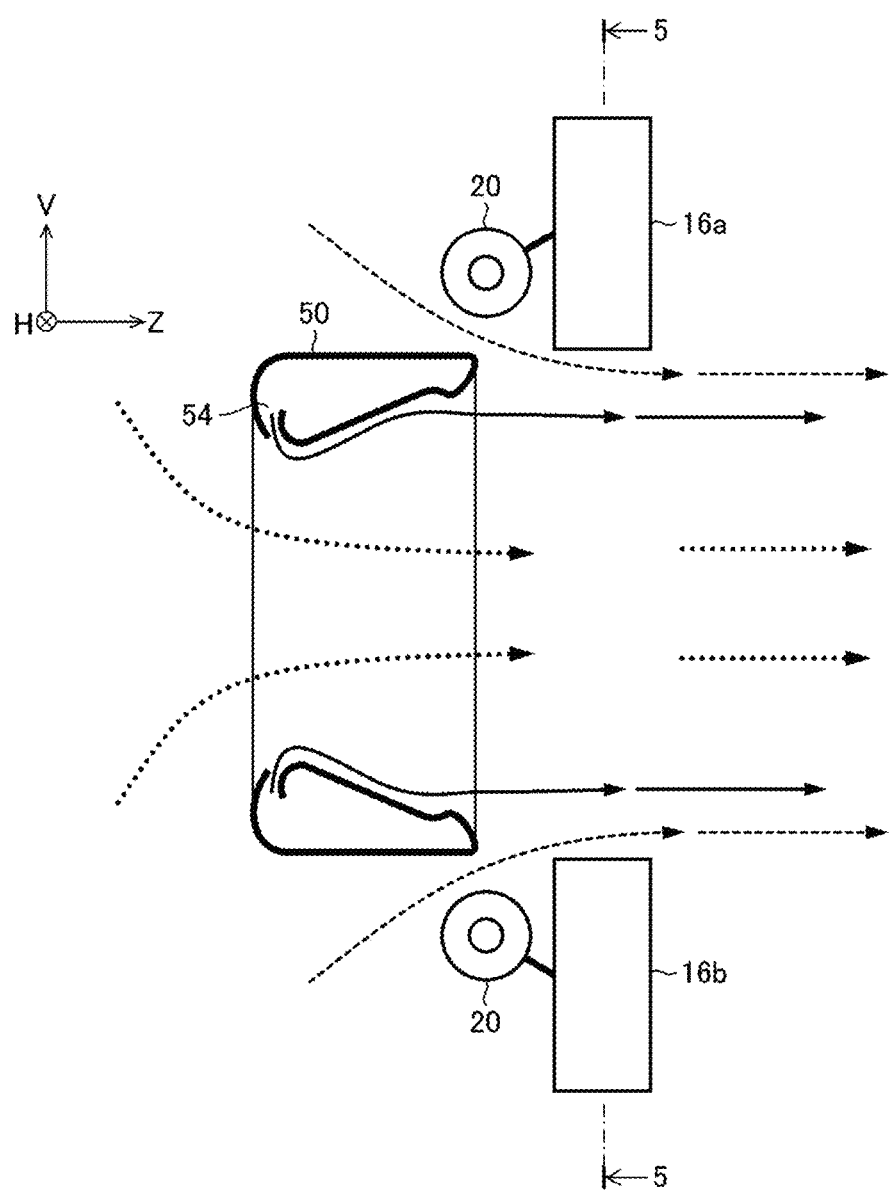
FIG. 4 is an enlarged view schematically showing a discharge unit and a ring in the chamber.
Figure 5:
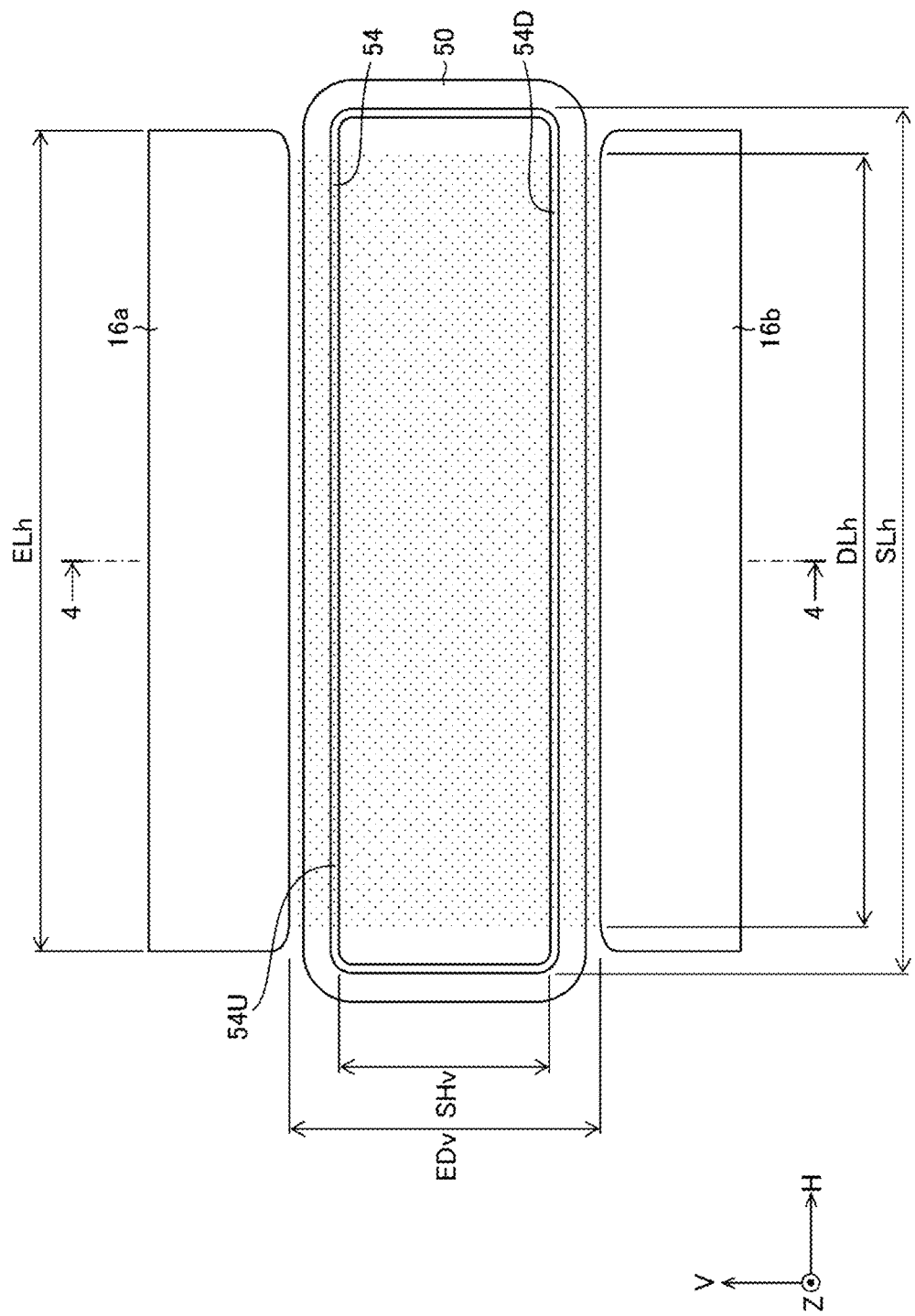
FIG. 5 is a sectional view along line 5-5 shown in FIG. 4.

FIG. 4 is an enlarged view schematically showing the discharge unit and the ring 50 in the chamber 12. FIG. 5 is a sectional view along line 5-5 shown in FIG. 4. Here, FIG. 4 is a sectional view along line 4-4 shown in FIG. 5. For convenience of explanation, as shown in FIGS. 4 and 5, an orthogonal coordinate system of a V axis, an H axis, and a Z axis is defined. The V-axis direction is the direction in which the electrodes 16a, 16b face each other, that is, the direction of an electrode gap EDv between the electrodes 16a, 16b (vertical direction in FIG. 4). The H-axis direction is the longitudinal direction of the electrodes 16a, 16b, that is, the direction of an electrode length ELh (lateral direction in FIG. 5). The Z-axis direction is the short-side direction of the electrodes 16a, 16b (lateral direction in FIG. 4, i.e., direction perpendicular to the paper surface of FIG. 5). The direction in which the gas flowing between the electrodes 16a, 16b advances (gas flow direction) is defined as the positive side of the Z axis. The Z-axis direction is an example of the "first direction" in the present disclosure. The H-axis direction is an example of the "second direction" in the present disclosure. The V-axis direction is an example of the "third direction" in the present disclosure.

As shown in FIG. 4, the ring 50 is arranged upstream of the electrodes 16a, 16b with respect to the gas flow. The ring 50 is provided with the ring-shaped slit 54 along the inner circumferential surface of the ring 50. As shown in FIG. 5, the ring 50 has a substantially rectangular and horizontally elongated shape when viewed from the Z-axis direction. The "substantially rectangular shape" includes a shape in which the portion of the four corners of the rectangle are changed to an arc-shaped curve (rounded rectangle). In the substantially rectangular ring-shaped slit 54, a slit portion 54U corresponding to the upper side and a slit portion 54D corresponding to the lower side are arranged parallel to the H-axis direction. The slit 54 may have an opening width (slit width) of, for example, about several millimeters.

A slit length SLh in the H-axis direction in the ring 50 is preferably equal to or longer than the discharge length DLh in the H-axis direction. That is, it is preferable to satisfy SLh≥DLh. The discharge length DLh is the length of the discharge space in the H-axis direction. An electrode gap EDv is the length of the discharge space in the V-axis direction. The ring 50 is made of, for example, an insulating material (dielectric) such as ceramic or resin.

Further, as shown in FIG. 5, the slit 54 is arranged so as to be fitted within the electrode gap EDv. That is, the slit 54 is arranged in a space in which the discharge space is extended in the Z-axis direction. The slit height SHv of the ring 50 in the V-axis direction is set so that the required flow volume and the required flow velocity to be described later can be obtained. The slit height SHv is not particularly limited with respect to the electrode gap EDv, but the slit height SHv is preferably smaller than the electrode gap EDv.

Here, the shape of the ring 50 is not limited to a substantially rectangular shape as shown in FIG. 5, and may be a shape such as an elongated circle in which the short side portions form arc-shaped curves.

2.2 Operation 2.2.1 Operation Principle of Ring

Figure 6:
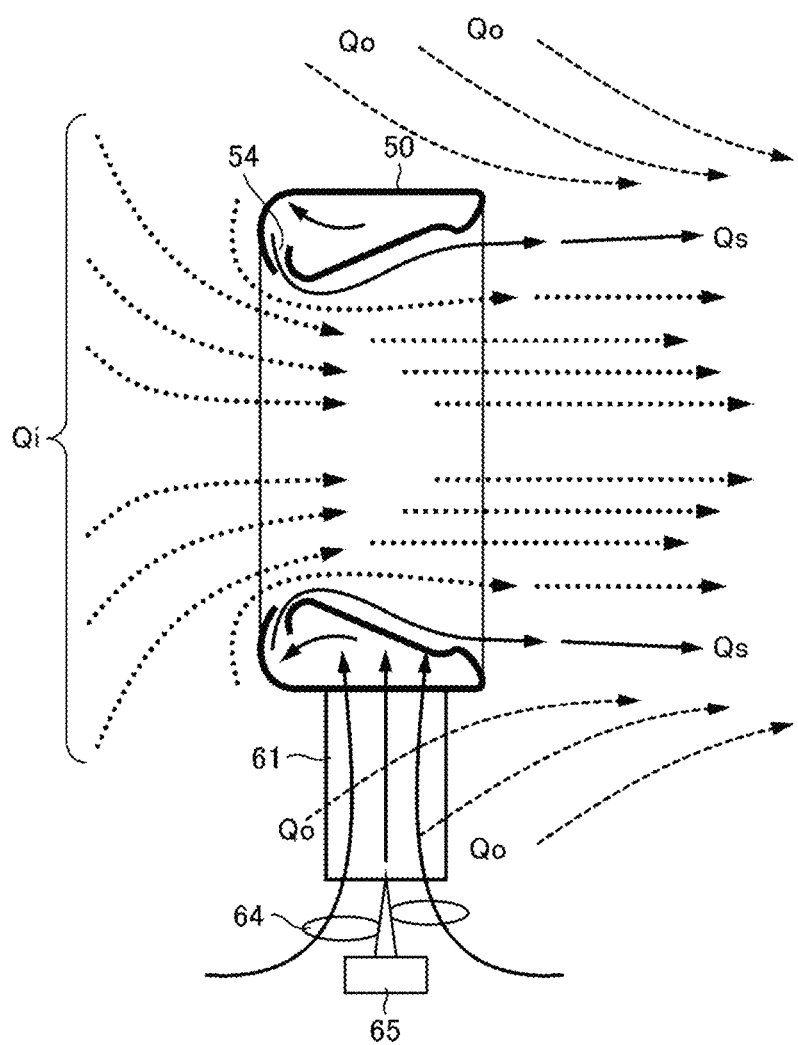
FIG. 6 is a schematic diagram showing the operation principle of the ring.
Figure 7:
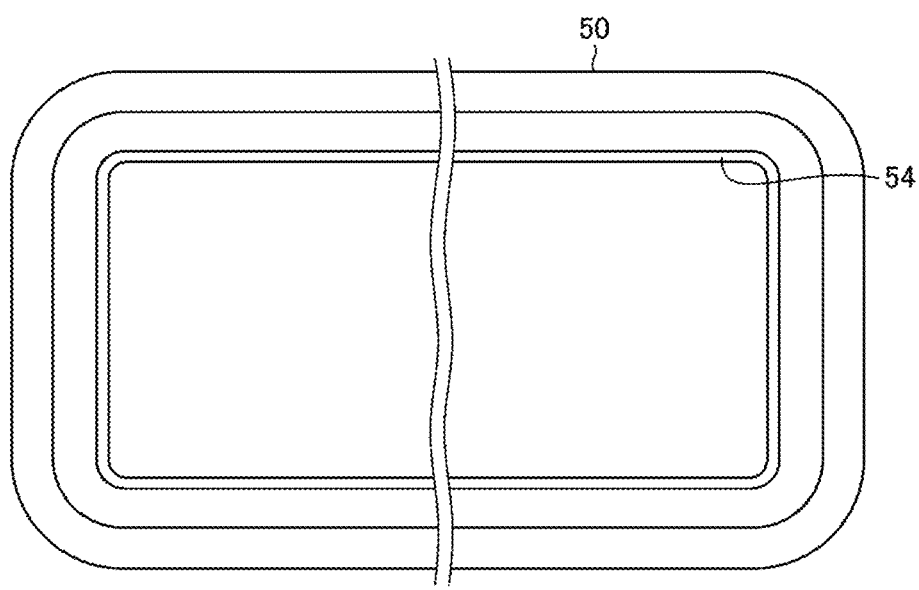
FIG. 7 is a front view of the ring when viewed from the downstream side toward the upstream side of the gas flow.

FIG. 6 is a schematic diagram showing the operation principle of the ring 50. FIG. 7 is a front view of the ring 50 when viewed from the downstream side toward the upstream side of the gas flow. As shown in FIGS. 6 and 7, the gas blowing out from the slit 54 flows along the inner wall of the ring 50. This gas flow reduces the pressure inside the ring 50, thus forming gas flow while taking in the gas outside the ring 50 together. Thus, the flow rate of the air flowing to the downstream side of the ring 50 is increased more than the amount of the gas blowing out from the slit 54.

Assuming that the flow volume of the gas blowing out from the slit 54 is Qs and the flow volume after amplification is Qa, the flow volume Ga after amplification is expressed by the following equation (1).

$$Qa = A \times Qs \tag{1}$$

The proportional constant A in equation (1) is called an amplification factor.

Further, the flow volume Qa after amplification is the sum of the flow volume Qi passing through the inside of the ring 50, the flow volume Qo taken in from the outside of the ring 50, and the flow volume Qs blowing out from the slit 54, and is expressed by the following equation (2).

$$Qa = Qi + Qo + Qs \tag{2}$$

From equations (1) and (2), the amplification factor A is expressed by the following equation (3).

$$A = (Qi + Qo + Qs)/Qs \tag{3}$$

Here, the flow volume Qs blowing out from the slit 54 is referred to as the "slit blow-out amount."

2.2.2 Specific Numerical Example

In order to cause laser oscillation at a high repetition frequency in an excimer laser device, it is necessary to generate, between the electrodes 16a, 16b, a gas flow having an air velocity (gas flow velocity) V (m/s) or more shown by the following equation (4).

$$V = f \times w \tag{4}$$

Here, f in equation (4) is the repetition frequency. The unit of f is hertz [Hz]. Further, w is the discharge width in the gas flow direction. The unit of w is meter [m].

Equation (4) corresponds to calculation in the case in which the clearance ratio (CR) value is 1. The CR value is a value indicating how many times the gas in the discharge space is replaced between pulses. That is, the flow volume Qa [m$^3$/s] passing through the discharge space per unit time is expressed by the following equation (5).

$$Qa = f \times w \times \text{discharge length } DLh \times \text{electrode gap } EDv \tag{5}$$

Here, specific values of the repetition frequency f [Hz], the discharge width w [m], the discharge length DLh [m], and the electrode gap EDv [m] are exemplified as follows.

$f$=6000 [Hz], $w$=0.003 [m], DL$h$=0.55 [m], ED$v$=0.016 [m]

Substituting these exemplary values into equations (4) and (5), the required minimum flow velocity Vmin and the required minimum flow rate Qamin are calculated as follows.

Required minimum flow velocity $V$min=6000 [Hz]× 0.003 [m]=18 [m/s]

Required minimum flow rate $Q$amin=6000 [Hz]× 0.003 [m]×0.55 [m]×0.016 [m]=0.1584 [m³/s]

Parameters such as the slit height SHv, the slit length SLh, the capacity of the motor 65, and the rotation speed of the fan 64, the shape of the ring 50, and the arrangement of the ring 50 are determined so as to satisfy the required minimum flow rate Qamin and maximize the amplification factor A.

2.3 Effect

According to the laser device 100 of the first embodiment, as compared with the laser device 10 according to the comparative example, since the fan 64 is located at a blind position from the discharge unit, deterioration of energy stability due to acoustic waves is suppressed.

Further, the flow volume to forcibly form the gas flow using the fan 64 and the motor 65 may be only the slit blow-out amount Qs. While the configuration of the laser device according to the comparative example described with reference to FIGS. 1 and 2 requires the cross flow fan 30 and the motor 32 that circulate an flow volume corresponding to Qi+Qo+Qs (=A×Qa), the blowing method according to the configuration of the first embodiment only needs to generate the slit blow-out amount Qs that is 1/A of the minimum required flow rate, and thus the configuration including the fan 64 and the motor 65 can be reduced in size and cost.

3. Second Embodiment 3.1 Configuration

Figure 8:
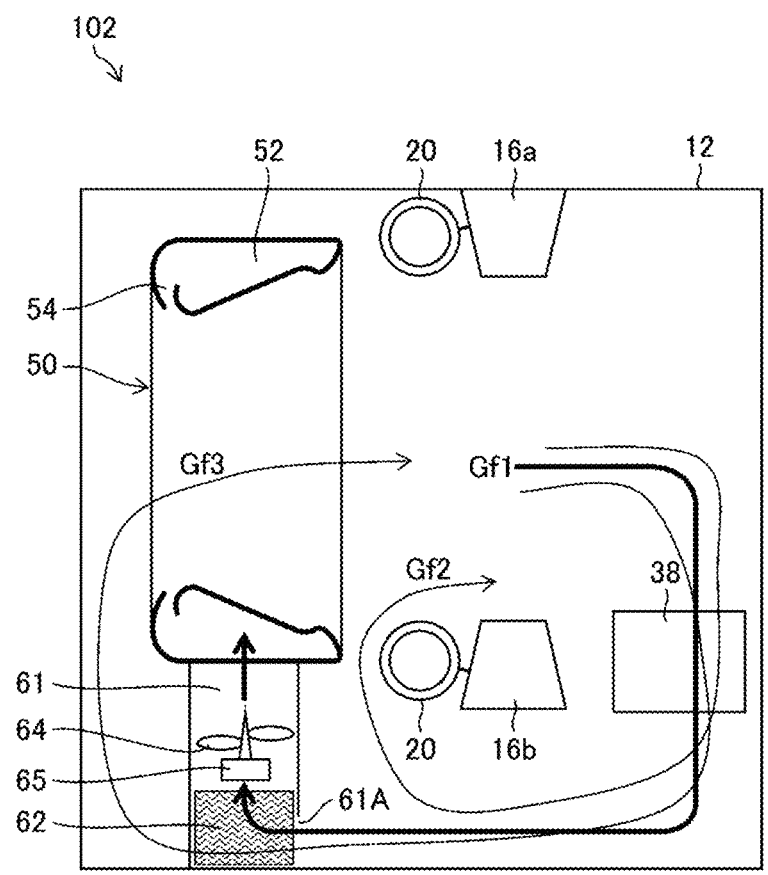
FIG. 8 shows a configuration example of the laser device according to a second embodiment.

FIG. 8 schematically shows a configuration example of a laser device 102 according to a second embodiment. The configuration shown in FIG. 8 will be described on differences from the configuration shown in FIG. 3. In FIG. 3, the configuration in which the gas flow path 60 is provided outside the chamber 12 has been described, but in the laser device 102 shown in FIG. 8, a gas circulation path is configured inside the chamber 12 without providing the gas flow path 60 outside the chamber 12, and the gas circulates in the chamber 12.

That is, a gas flow path 61 arranged inside the chamber 12 has a suction port 61A for suctioning the gas in the chamber 12, and the dust filter 62 is arranged in the vicinity of the suction port 61A of the gas flow path 61.

The fan 64 is arranged between the dust filter 62 and the ring 50 in the gas flow path 61. The motor 65 may be arranged in the gas flow path 61, but as shown in FIGS. 9 and 10, the motor 65 is preferably arranged outside the chamber 12 and is not exposed to the fluorine gas.

Figure 9:
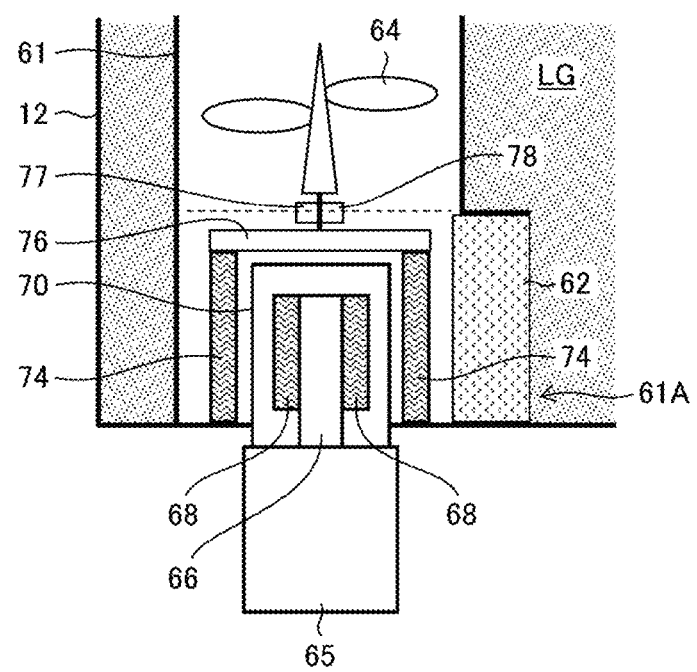
FIG. 9 schematically shows an example of the arrangement structure of a motor to which a magnetic coupling method is applied.

FIG. 9 schematically shows an example of the arrangement structure of the motor 65 to which a magnetic coupling method is applied. The structure shown in FIG. 9 is a so-called in-out type magnetic coupling, in which a cylindrical drive-side magnet 68 is arranged on a shaft of a motor 65, and a cylindrical passive-side magnet 74 is arranged outside the drive-side magnet 68. A partition wall is arranged between the drive-side magnet 68 and the passive-side magnet 74. The partition wall 70 covers the circumference of the passive-side magnet 74 so that the motor 65 and the drive-side magnet 68 are not exposed to laser gas LG including fluorine gas. The motor 65 is arranged outside the chamber 12 across the partition wall 70. A rotation plate 76 is fixed to the passive-side magnet 74, and a shaft 77 of the rotation plate 76 is rotatably supported by a bearing 78. The fan 64 is coupled to the shaft 77 of the rotation plate 76.

Figure 10:
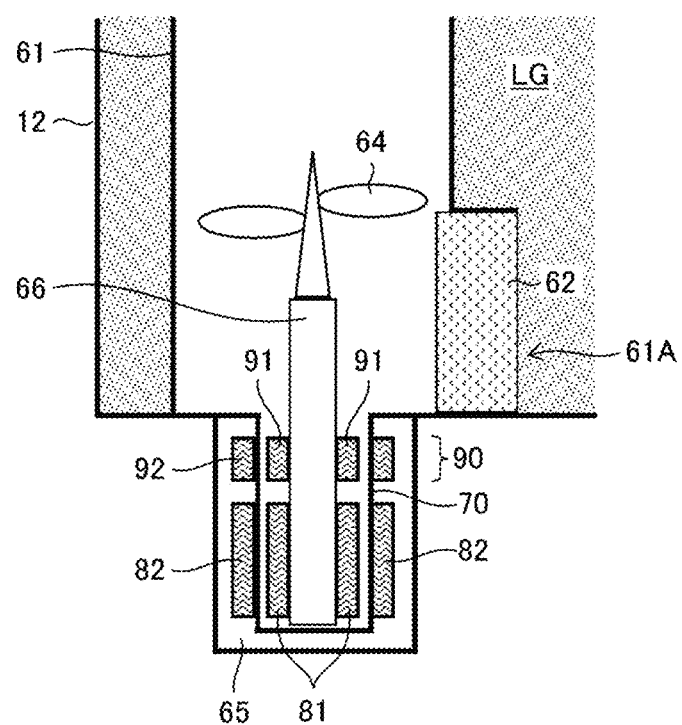
FIG. 10 schematically shows an example of the arrangement structure of the motor to which a magnetic bearing method is applied.

FIG. 10 schematically shows an example of the arrangement structure of the motor 65 to which a magnetic bearing method is applied. As shown in FIG. 10, the motor 65 includes a rotor 81 and a stator 82, and the shaft 66 of the motor 65 is rotatably supported by a magnetic bearing 90. The magnetic bearing 90 includes an inner ring magnet 91 and an outer ring magnet 92. The inner ring magnet 91 is fixed to the shaft 66.

The circumference of the shaft 66 including the rotor 81 and the inner ring magnet 91 is covered by the partition wall 70, so that the stator 82 and the outer ring magnet 92 are not exposed to the fluorine gas. The fan 64 is coupled to the shaft 66.

3.2 Operation

In the laser device 102 according to the second embodiment, when the motor 65 is driven to rotate the fan 64, the laser gas LG in the chamber 12 is suctioned into the gas flow path 61 from the suction port 61A of the gas flow path 61, and the laser gas LG is sent to the internal passage 52 of the ring 50 through the gas flow path 61 and blows out from the slit 54. The operation of blowing air by the ring 50 is similar to that of FIG. 6. As shown in FIG. 8, the laser gas LG having passed through the discharge space passes through the radiator 38, and a part of the laser gas LG flows into the suction port 61A again. Thus, the laser gas LG is circulated in the chamber 12. The other operation is the same as that of the first embodiment.

3.3 Effect

According to the second embodiment, similarly to the first embodiment, deterioration of energy stability due to acoustic waves is suppressed. Further, according to the second embodiment, it is possible to reduce the size and the cost as compared with the comparative example. Further, in the second embodiment, it is not necessary to provide the gas flow path 60 outside the chamber 12 as compared with the first embodiment, and it is possible to further reduce the size.

4. Third Embodiment 4.1 Configuration

Figure 11:
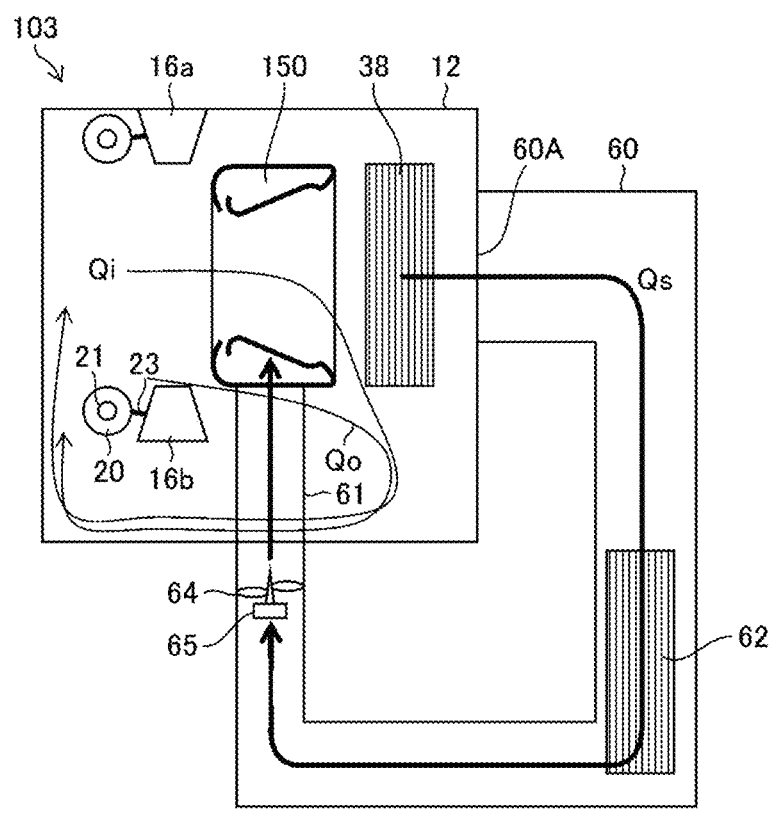
FIG. 11 schematically shows a configuration example of the laser device according to a third embodiment.

FIG. 11 schematically shows a configuration example of a laser device 103 according to a third embodiment. The configuration shown in FIG. 11 will be described on differences from the configuration shown in FIG. 3.

Although the ring 50 is arranged on the upstream side of the gas flow with respect to the electrodes 16a, 16b in FIG. 3, in the laser device 103 shown in FIG. 11, a ring 150 is arranged on the downstream side of the gas flow than the electrodes 16a, 16b. The configuration of the ring 150 may be similar to that of the ring 50 in FIG. 3. The ring 150 is an example of a "nozzle structure" in the present disclosure.

4.2 Operation

Figure 12:
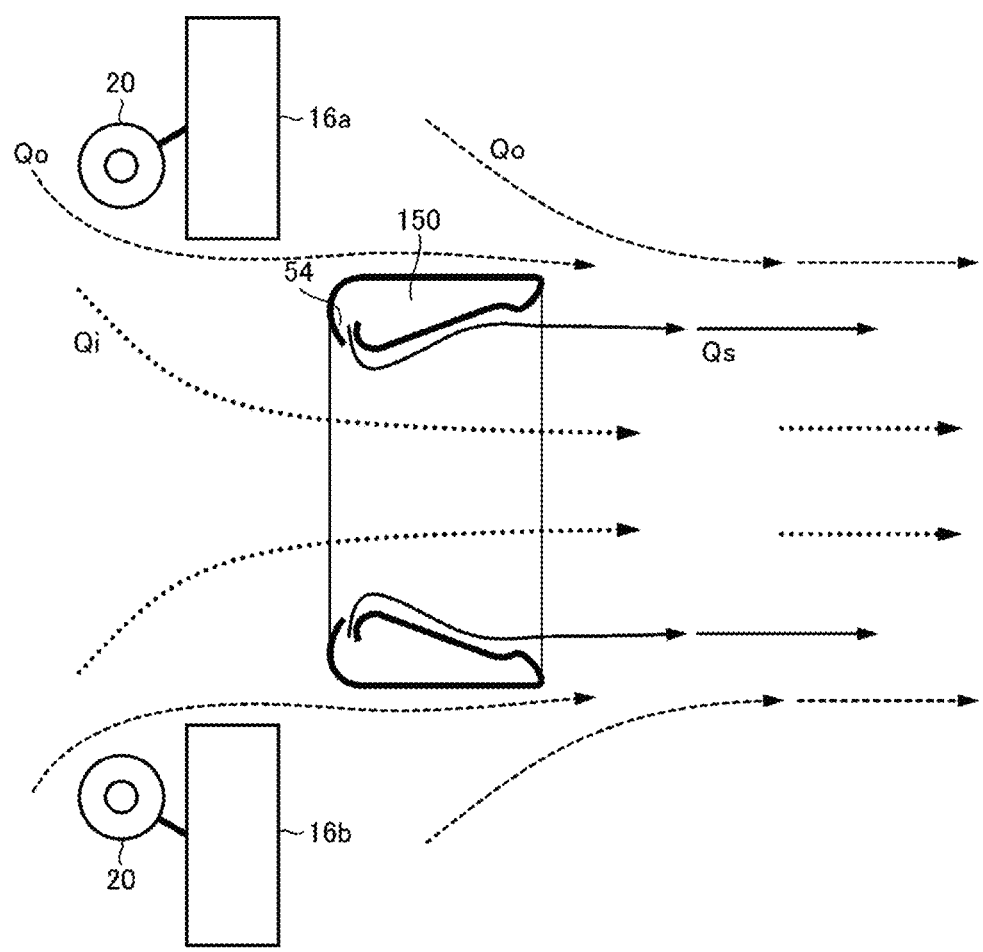
FIG. 12 schematically shows the gas flow in the vicinity of the discharge unit and the ring in the chamber in the third embodiment.

The configuration shown in FIG. 11 utilizes the suction of the gas into the ring 150 to generate the gas flow between the electrodes 16a, 16b. FIG. 12 schematically shows the gas flow in the vicinity of the discharge unit and the ring 150 in the third embodiment. As shown in FIG. 12, due to the gas blowing out from the slit 54 of the ring 150, the gas flow coming out from the slit 54 is amplified by A times as taking in the surrounding gas. Among the flow volume Qo taken in from the outside of the ring 150, a part passes between the electrodes 16a, 16b, and another part does not pass between the electrodes 16a, 16b.

The gas flow volume passing between the electrodes 16a, 16b is larger than the slit blow-out amount Qs. On the other hand, as compared with the configuration of the first embodiment, since the flow volume passing between the electrodes 16a, 16b, among the flow volume Qo taken in from the outside of the ring 150, is reduced, the flow velocity between the electrodes 16a, 16b decreases with respect to that in the first embodiment.

4.3 Effect

According to the third embodiment, although the amplification efficiency of the gas flow is slightly lowered as compared with the first embodiment and the second embodiment, deterioration of energy stability due to acoustic waves is suppressed as compared with the comparative example, and it is possible to reduce the size and the cost.

5. Fourth Embodiment

5.1 Configuration

Figure 13:
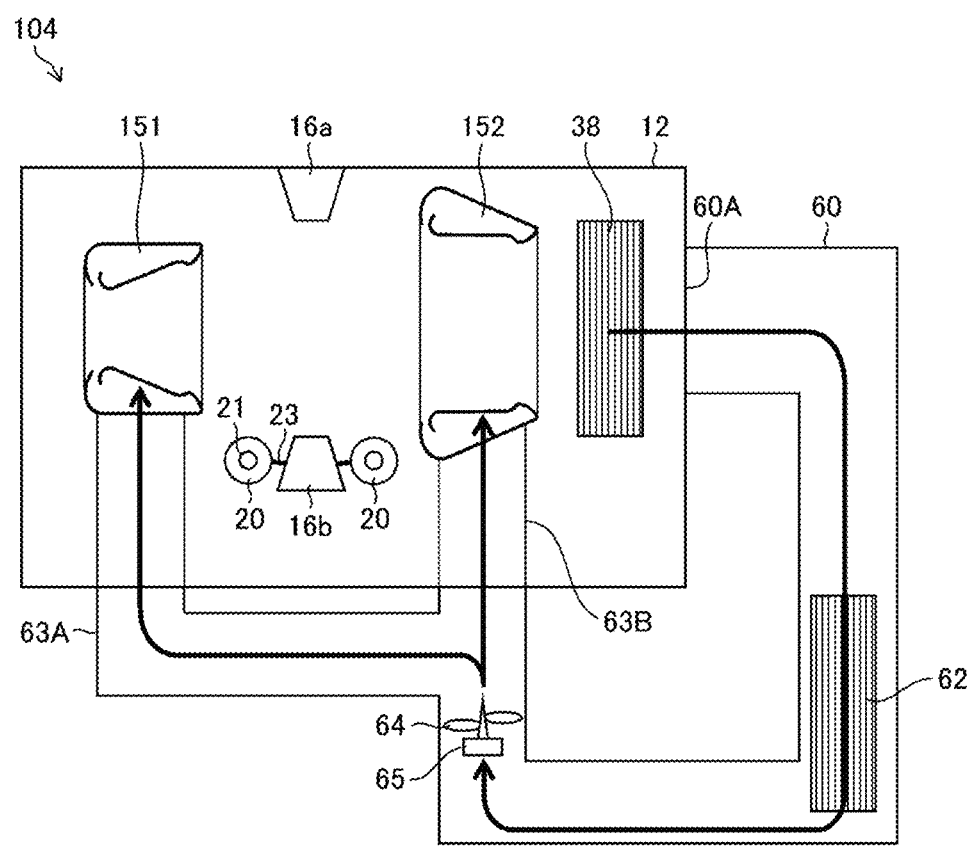
FIG. 13 schematically shows the configuration of the laser device according to a fourth embodiment.

FIG. 13 schematically shows the configuration of a laser device 104 according to a fourth embodiment. The configuration shown in FIG. 13 will be described on differences from the configuration shown in FIG. 3. In the laser device 104 according to the fourth embodiment shown in FIG. 13, rings 151, 152 are arranged respectively on both the upstream side and the downstream side of the electrodes 16a, 16b with respect to the gas flow passing between the electrodes 16a, 16b. The ring 151 arranged on the upstream side of the electrodes 16a, 16b with respect to the gas flow is referred to as the "first ring 151", and the ring 152 arranged on the downstream side of the electrodes 16a, 16b is referred to as the "second ring 152."

A part of the gas flow path 60 on the downstream side of the fan 64 is branched into two paths. A first branched gas flow path 63A which is one branched path is connected to the first ring 151, and a second branched gas flow path 63B which is the other branched path is connected to the second ring 152.

Figure 14:
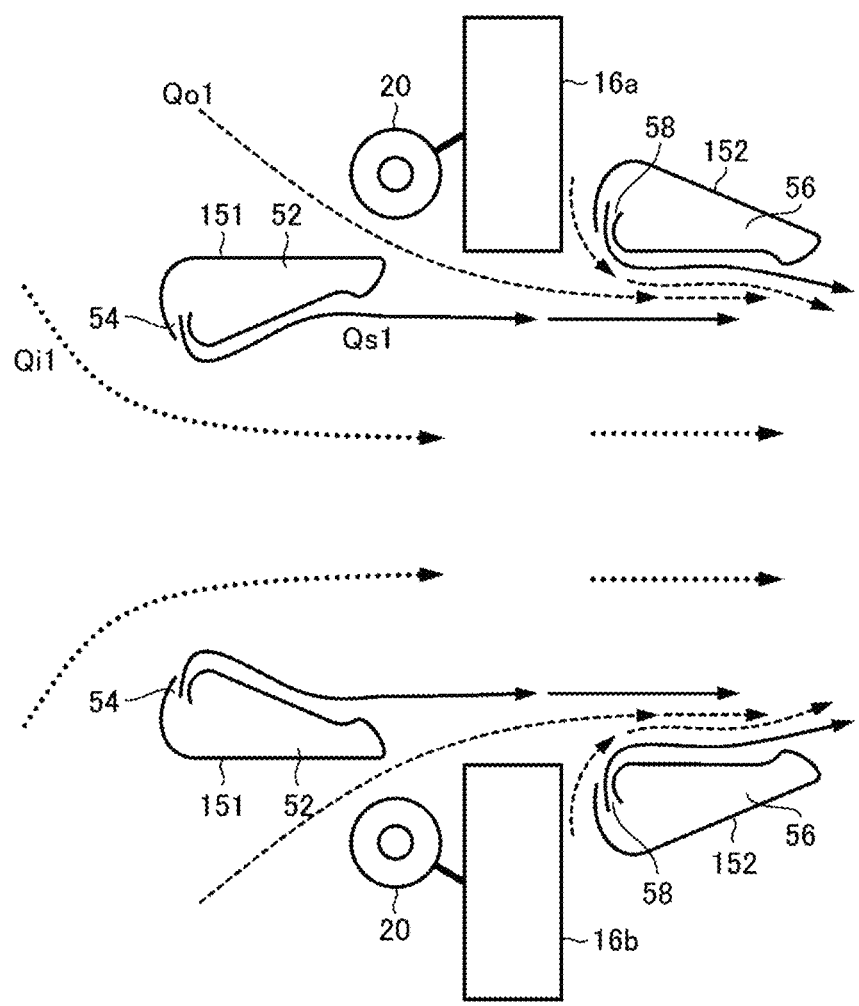
FIG. 14 is an enlarged view schematically showing a first ring, the discharge unit, and a second ring in the chamber of the fourth embodiment.

FIG. 14 is an enlarged view schematically showing the first ring 151, the discharge unit, and the second ring 152 in the chamber 12 of the fourth embodiment. The configuration of each of the first ring 151 and the second ring 152 may be similar to that of the ring 50 described in FIGS. 3 to 7.

The second ring 152 has an internal passage 56 and a slit 58. The first ring 151 is an example of the "first nozzle structure" in the present disclosure, and the second ring 152 is an example of the "second nozzle structure" in the present disclosure.

The slit portion 54U of the upper side of the slit 54 of the first ring 151 (see FIG. 5) is an example of the "third slit" in the present disclosure, and the slit portion 54D of the lower side (see FIG. 5) is an example of the "fourth slit" in the present disclosure. Similarly, the slit portion of the upper side of the slit 58 of the second ring 152 is an example of the "fifth slit" in the present disclosure, and the slit portion of the lower side is an example of the "sixth slit" in the present disclosure. As shown in FIG. 14, the slit height of the slit 58 of the second ring 152 is preferably larger than the slit height of the slit 54 of the first ring 151.

5.2 Operation

As shown in FIG. 14, when the gas blows out from the slit 54 of the first ring 151 by the slit blowing amount Qs1, the flow volume is amplified while taking in the surrounding gas, the amplified flow volume Qa1 flows downstream of the first ring 151, and the amplified flow volume Qa1 becomes the suction of the second ring 152.

The flow volume Qa1 after amplification is the sum of the flow volume Qi1 passing through the inside of the first ring 151, the flow volume Qo1 taken in from the outside of the first ring 151, and the flow volume Qs1 blowing out from the slit 54, and is expressed by the following equation (6).

$$Qa1 = Qi1 + Qo1 + Qs1 \qquad (6)$$

5.3 Effect

When the ring 50 is installed in the chamber 12, the electrode gap EDv of several 10 mm and other structures cause a large pressure loss, and a necessary flow amount may not be obtained between the electrodes 16a, 16b, so that there is a case in which the amplification factor A in an ideal state may not be obtained.

In order to solve this problem, it is conceivable to adopt a method of increasing the rotation speed of the fan 64 and the motor 65 while maintaining a low amplification factor, or to adopt the configuration shown in FIG. 14.

In the fourth embodiment shown in FIG. 14, the configuration in which the first ring 151 and the second ring 152 are arranged respectively on the upstream and the downstream of the electrodes 16a, 16b causes the blowing out from the first ring 151 to serve as the suction of the second ring 152. That is, since the operation of the first ring 151 and the second ring 152 reduces the pressure loss between the electrodes 16a, 16b, the gas flow becomes smooth, leading to an increase in the gas flow volume and the gas flow velocity between the electrodes 16a, 16b.

5.4 Modification

Figure 15:
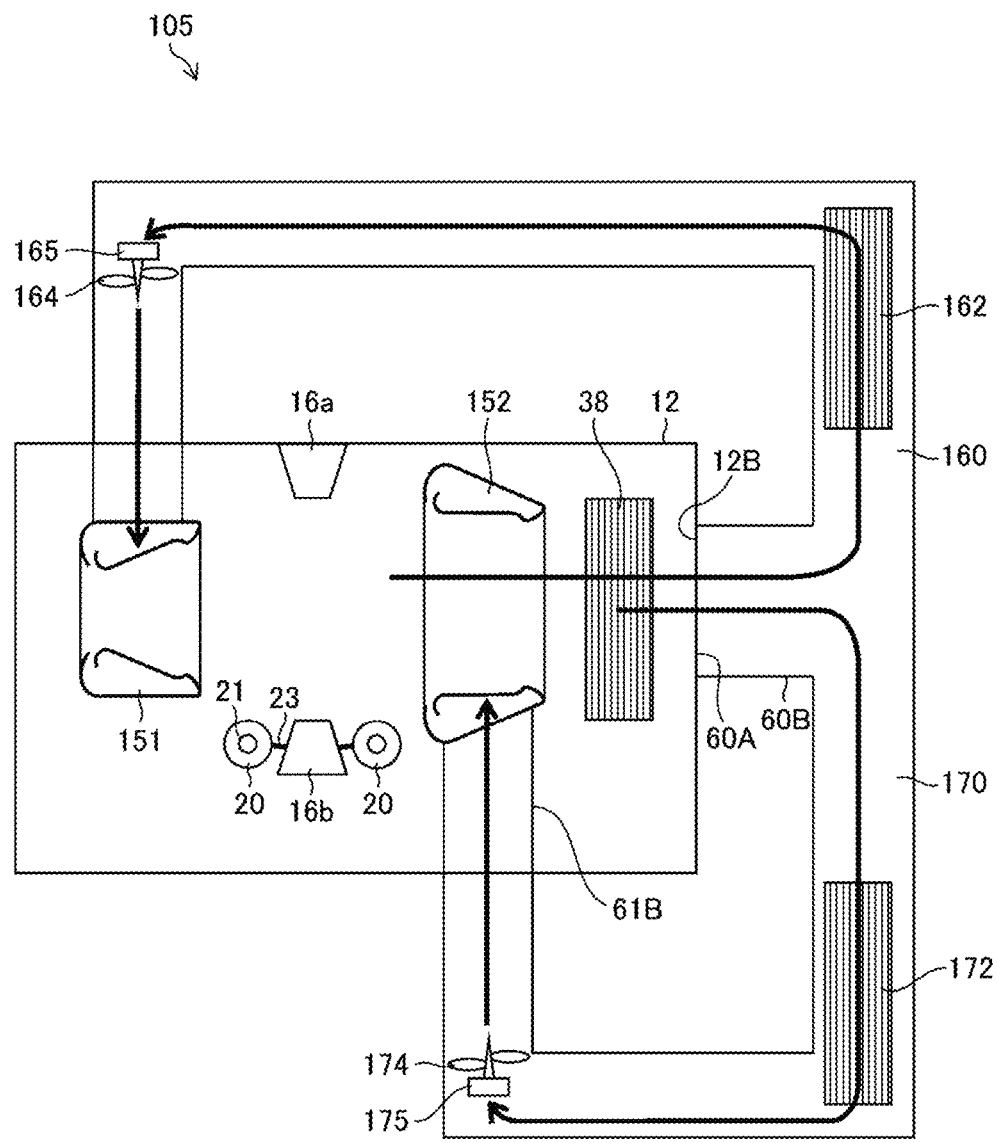
FIG. 15 schematically shows the configuration of a laser device according to a modification of the fourth embodiment.

FIG. 15 schematically shows the configuration of a laser device 105 according to a modification of the fourth embodiment. The configuration shown in FIG. 15 will be described on differences from the configuration shown in FIG. 13.

The laser device 105 includes a first gas flow path 160 connected to the first ring 151 and a second gas flow path 170 connected to the second ring 152, and dust filters 162, 172, fans 164, 174, and motors 165, 175 are arranged respectively in the gas flow paths. Each of the first gas flow path 160 and the second gas flow path 170 may be a branch pipe line (branch pipe) branched from a main pipe 60B. The suction port 60A of the main pipe 60B is connected to a gas outlet 12B of the chamber 12. The main pipe 60B may be considered as a part of the first gas flow path 160 or a part of the second gas flow path 170.

The configuration including the first gas flow path 160, the dust filter 162, the fan 164, and the motor 165 may be similar to the configuration including the gas flow path 60, the dust filter 62, the fan 64, and the motor 65 shown in FIG. 3. Further, the configuration including the second gas flow path 170, the dust filter 172, the fan 174, and the motor 175 may be similar to the configuration including the gas flow path 60, the dust filter 62, the fan 64, and the motor 65 shown in FIG. 11.

6. Fifth Embodiment

6.1 Configuration

Figure 16:
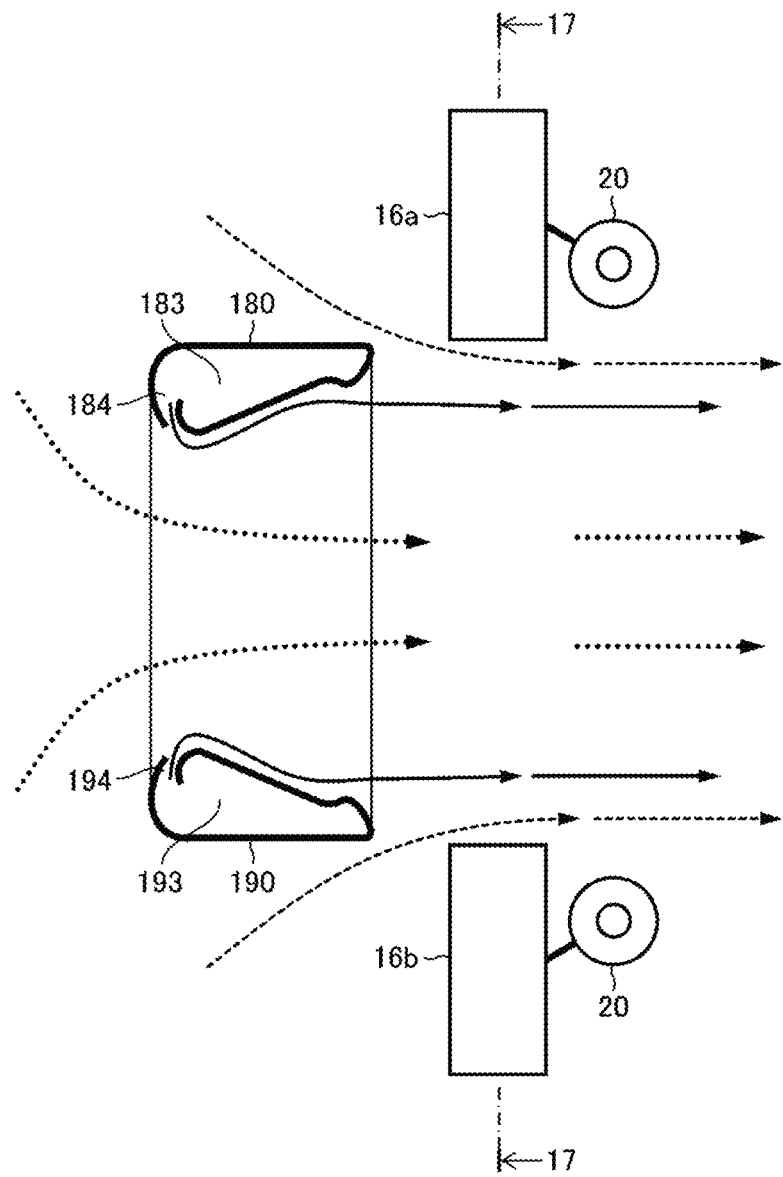
FIG. 16 schematically shows a configuration example of the discharge unit and slit-formed bars in the chamber in the laser device according to a fifth embodiment.
Figure 17:
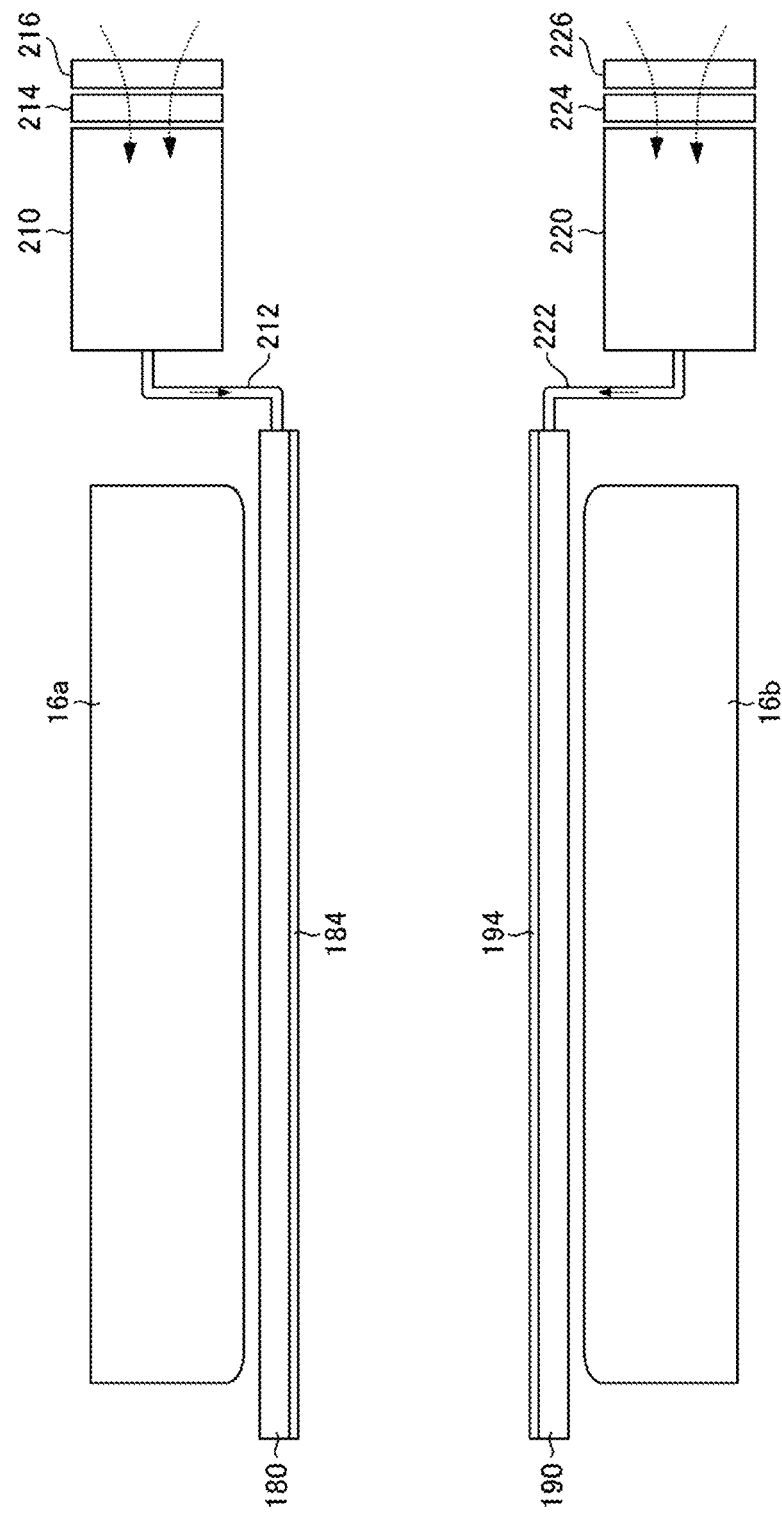
FIG. 17 is a sectional view along line 17-17 shown in FIG. 16.

FIG. 16 schematically shows a configuration example of the discharge unit and slit-formed bars 180, 190 in the chamber in the laser device according to a fifth embodiment. FIG. 17 is a sectional view along line 17-17 shown in FIG. 16. The configuration of the fifth embodiment shown in FIGS. 16 and 17 will be described on differences from the configuration of the first embodiment.

In the fifth embodiment, the slit-formed bars 180, 190 are provided in place of the ring 50. The pair of bars 180, 190 have a configuration corresponding to the elements of the long side portion arranged in parallel with the electrodes 16a, 16b in the ring 50 described with reference to FIGS. 4 and 5. Each of the bars 180, 190 has a hollow bar-like structure. That is, the bar 180 includes an internal passage 183 for receiving the gas and a slit 184 which serves as a gas blow out port. The bar 180 is arranged near the electrode 16a, which is a cathode electrode. The bar 190 includes an internal passage 193 for receiving the gas and a slit 194 which serves as a gas blow out port. The bar 190 is arranged near the electrode 16b, which is an anode electrode.

The two bars 180, 190 are arranged in parallel with the electrodes 16a, 16b, and the bars 180, 190 are arranged to face each other such that the slits 184, 194 face each other. Each of the bars 180, 190 is an example of the "nozzle structure" in the present disclosure. The slit 184 is an example of the "first slit" in the present disclosure, and the slit 194 is an example of the "second slit" in the present disclosure.

Further, in the fifth embodiment, compressors 210, 220 are used in place of a blower device including the fan 64 and the motor 65. The compressors 210, 220 may each be a turbo compressor. Each of the compressors 210, 220 is an example of the "blower device" in the present disclosure.

The compressor 210 is connected to the bar 180 via a gas flow path 212. Similarly, the compressor 220 is connected to the bar 190 via a gas flow path 222. Since each of the gas flow paths 212, 222 is designed to increase pressure to the maximum, it is preferable that radiators 214, 224 and dust filters 216, 226 are arranged respectively on the primary side of the compressors 210, 220.

6.2 Operation

The compressors 210, 220 generate pressure which causes the gas to blow out from the slits 184, 194. The gas blowing out from the slits 184, 194 passes between the electrodes 16a, 16b, and returns to the primary side of the compressors 210, 220 after passing through a gas path (not shown).

6.3 Effect

According to the fifth embodiment, by using the compressors 210, 220 for pressure-feeding the gas, it is possible to set the pressure at the portion of the slits 184,194 to be higher than that by using a blower device such as a fan and a blower. Therefore, more gas can be caused to blow out from the slits 184, 194, and as a result, more gas can be caused to flow between the electrodes 16a, 16b at a high speed.

6.4 Modification

It is also possible to use the ring 50 in place of any of the bars 180, 190. In this case, either one of the compressors 210, 220 can be omitted. The device for feeding the gas to the bars 180,190 is not limited to the compressors 210, 220, and may be a blower device such as a fan and a blower.

7. Sixth Embodiment 7.1 Configuration

Figure 18:
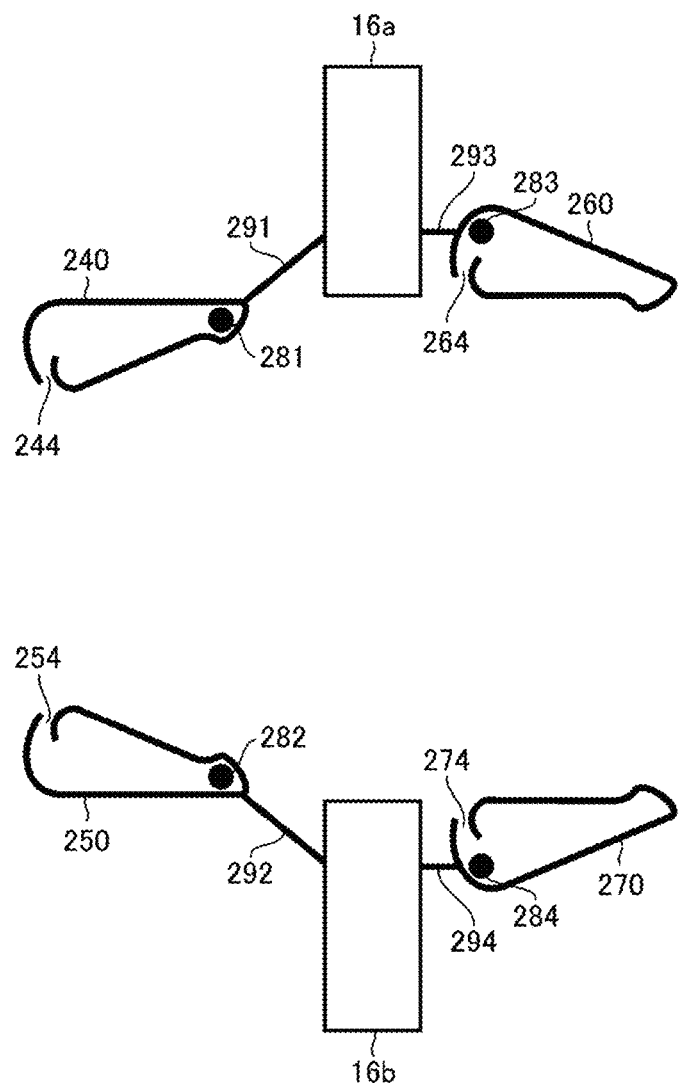
FIG. 18 schematically shows the configuration of the discharge unit in the chamber of the laser device according to a sixth embodiment.

FIG. 18 schematically shows the configuration of the discharge unit in the chamber of the laser device according to a sixth embodiment. In the laser device according to the sixth embodiment, slit-formed bars 240, 250 are arranged respectively on the side surface portion of the electrodes 16a, 16b on the upstream side, and slit-formed bars 260, 270 are arranged respectively on the side surface portion of the electrodes 16a, 16b on the downstream side.

A corona inner electrode 281 is arranged inside the bar 240. Similarly, corona inner electrodes 282, 283, 284 are arranged respectively inside the bars 250, 260, 270. Other configuration of each of the bars 240, 250, 260, 270 may be similar to that of each of the bars 180, 190 described in FIG. 16. The bars 240, 250, 260, 270 are each made of a dielectric material.

Corona outer electrodes 291, 292 are attached to the upstream side surfaces of the electrodes 16a, 16b, respectively. Similarly, corona outer electrodes 293, 294 are attached to the downstream side surfaces of the electrodes 16a, 16b, respectively.

Regarding the bar 240, the dielectric bar 240 is sandwiched between the corona outer electrode 291 and the corona inner electrode 281 inside the bar 240. The same applies to the other bars 250, 260, 270, that is, the bar 250 is sandwiched between the corona outer electrode 292 and the corona inner electrode 282, the bar 260 is sandwiched between the corona outer electrode 293 and the corona inner electrode 283, and the bar 270 is sandwiched between the corona outer electrode 294 and the corona inner electrode 284. Although FIG. 18 shows the configuration in which the corona outer electrodes 291, 292, 293, 294 are used, the dielectric bars 240, 250, 260, 270 may be provided in contact with the corresponding electrodes 16a, 16b without providing the corona outer electrodes 291, 292, 293, 294.

Further, in FIG. 18, the case in which four corona outer electrodes and four corona inner electrodes are provided has been described, but not limited thereto, the number of the corona outer electrodes and the number of the corona inner electrodes may each be one to three. Further, the configurations of the bars 240, 250, 260, 270 shown in FIG. 18 can be replaced with the configurations of the rings 151, 152 described in FIGS. 13 and 14.

7.2 Operation

The bars 240, 250 arranged upstream of the electrodes 16a, 16b exert the same function as the ring 151 at the upstream described with reference to FIG. 14. The bars 260, 270 arranged downstream of the electrodes 16a, 16b exert the same function as the ring 152 at the downstream described with reference to FIG. 14.

The bars 240, 250, 260, 270 blow out gas from their respective slits 244, 254, 264, 274 to increase the gas flow while entraining the surrounding gas.

A voltage is externally applied to the corona inner electrodes 281, 282, 283, 284 so as to obtain a predetermined potential difference with respect to the correspondingly-facing corona outer electrodes 291, 292, 293, 294. As a means for applying a voltage, a voltage-dividing capacitor may be used to divide the voltage between the cathode and anode electrodes 16a, 16b. When the potential difference between the inner and outer electrodes exceeds a certain value, corona discharge (dielectric barrier discharge) is generated, and the discharge light radiates between the electrodes 16a, 16b to ionize the gas.

Each of the bars 240, 250, 260, 270 is an example of the "nozzle structure" in the present disclosure. The slit 244 of the bar 240 and the slit 264 of the bar 260 are examples of the "first slit" in the present disclosure, and the slit 254 of the bar 250 and the slit 274 of the bar 270 are examples of the "second slit" in the present disclosure. Each of the bars 240, 250 and a combination thereof are examples of the "first nozzle structure" in the present disclosure, and each of the bars 260, 270 and a combination thereof are examples of the "second nozzle structure" in the present disclosure.

The slit 244 of the bar 240 is an example of the "third slit" in the present disclosure, and the slit 254 of the bar 250 is an example of the "fourth slit" in the present disclosure. The slit 264 of the bar 260 is an example of the "fifth slit" in the present disclosure, and the slit 274 of the bar 270 is an example of the "sixth slit" in the present disclosure.

7.3 Effect

According to the sixth embodiment, the bars 240, 250, 260, 270 which create the gas flow to be supplied between the electrodes 16a, 16b or a ring in place of these bars can also serve as a means for corona preionization, and a compact device can be designed. Further, according to the sixth embodiment, since corona emission is not blocked by the bars 240, 250, 260, 270 or a ring, preionization can be performed strongly.

8. Electronic Device Manufacturing Method

Figure 19:
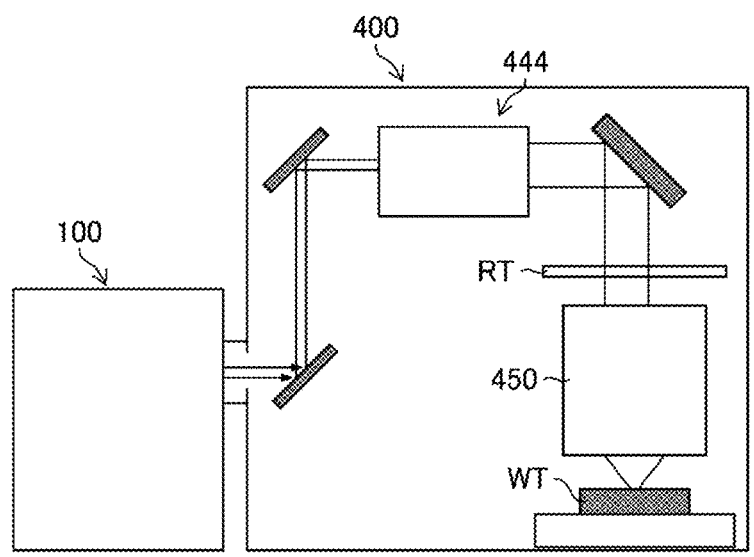
FIG. 19 schematically shows a configuration example of an exposure apparatus.

FIG. 19 schematically shows a configuration example of an exposure apparatus 400. The exposure apparatus 400 includes an illumination optical system 444 and a projection optical system 450. The illumination optical system 444 illuminates a reticle pattern of a reticle (not shown) arranged on a reticle stage RT with the laser light incident from the laser device 100. The projection optical system 450 causes the laser light transmitted through the reticle to be imaged as being reduced and projected on a workpiece (not shown) arranged on a workpiece table WT. The workpiece is a photosensitive substrate such as a semiconductor wafer on which resist is applied.

The exposure apparatus 400 synchronously translates the reticle stage RT and the workpiece table WT to expose the workpiece to the laser light reflecting the reticle pattern. After the reticle pattern is transferred onto the semiconductor wafer by the exposure process described above, a semiconductor device can be manufactured through a plurality of processes. The semiconductor device is an example of the "electronic device" in the present disclosure.

The laser device 100 in FIG. 19 may be one of the laser devices described as the second to sixth embodiments.

9. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser device, comprising:
   a chamber into which laser gas is introduced;
   a pair of electrodes arranged in the chamber;
   a power source configured to apply a voltage between the electrodes;
   a nozzle structure which includes an internal passage for receiving the laser gas and a slit connected to the internal passage and is configured to generate flow of the laser gas between the electrodes due to the laser gas blowing out from the slit;
   a gas flow path which has a suction port through which the laser gas in the chamber is suctioned and introduces, to the nozzle structure, the laser gas suctioned through the suction port; and
   a blower device configured to cause the laser gas to blow toward the internal passage of the nozzle structure through the gas flow path.

2. The laser device according to claim 1, wherein at least a part of the slit is arranged in a space extending a discharge space between the electrodes in a first direction being a short-side direction of the electrodes.

3. The laser device according to claim 2, wherein at least a part of the slit is parallel to a second direction being a longitudinal direction of the electrodes.

4. The laser device according to claim 3, wherein the slit includes a first slit and a second slit, the first slit and the second slit are arranged as being distanced in a third direction being a direction in which the pair of electrodes are faced to each other, and a distance between the first slit and the second slit in the third direction is smaller than a gap between the electrodes.

5. The laser device according to claim 3, wherein a length of the slit in the second direction is larger than a length of the electrodes in the second direction.

6. The laser device according to claim 1, wherein the nozzle structure is arranged on an upstream side of the electrodes with respect to flow of the laser gas flowing between the electrodes.

7. The laser device according to claim 1, wherein the nozzle structure is arranged on a downstream side of the electrodes with respect to flow of the laser gas flowing between the electrodes.

8. The laser device according to claim 1, wherein the nozzle structure includes a first nozzle structure and a second nozzle structure, the first nozzle structure is arranged on an upstream side of the electrodes with respect to flow of the laser gas flowing between the electrodes, and the second nozzle structure is arranged on a downstream side of the electrodes with respect to the flow of the laser gas flowing between the electrodes.

9. The laser device according to claim 8, wherein the first nozzle structure includes a third slit and a fourth slit as the slit, the second nozzle structure includes a fifth slit and a sixth slit as the slit, the third slit and the fourth slit are arranged as being distanced in a third direction being a direction in which the pair of electrodes are faced to each other, the fifth slit and the sixth slit are arranged as being distanced in the third direction, and a distance between the fifth slit and the sixth slit in the third direction is larger than a distance between the third slit and the fourth slit in the third direction.

10. The laser device according to claim 1, wherein the nozzle structure is ring-shaped, and the slit is provided on an inner circumferential surface of the ring-shaped nozzle structure.

11. The laser device according to claim 1, wherein the nozzle structure is bar-shaped.

12. The laser device according to claim 1, further comprising a dust filter arranged on a path on which the laser gas flows.

13. The laser device according to claim 1, further comprising:
a corona outer electrode connected to the electrode and the nozzle structure, and
a corona inner electrode arranged in the nozzle structure.

14. The laser device according to claim 1, wherein the nozzle structure is made of an insulating material.

15. The laser device according to claim 1, wherein the blower device includes a fan and a motor to rotate the fan.

16. The laser device according to claim 1, wherein the blower device includes a compressor.

17. The laser device according to claim 1, wherein the laser gas includes fluorine.

18. The laser device according to claim 1, wherein at least a part of the gas flow path is provided outside the chamber.

19. The laser device according to claim 1, wherein the gas flow path is provided in the chamber, and the laser gas is circulated in the chamber.

20. An electronic device manufacturing method, comprising:
generating laser light using a laser device;
outputting the laser light to an exposure apparatus; and
exposing a photosensitive substrate to the laser light in the exposure apparatus to manufacture an electronic device,
the laser device including:
a chamber into which the laser gas is introduced;
a pair of electrodes arranged in the chamber;
a power source configured to apply a voltage between the electrodes;
a nozzle structure which includes an internal passage for receiving the laser gas and a slit connected to the internal passage and is configured to generate flow of the laser gas between the electrodes due to the laser gas blowing out from the slit;
a gas flow path which has a suction port through which the laser gas in the chamber is suctioned and introduces, to the nozzle structure, the laser gas suctioned through the suction port; and
a blower device configured to cause the laser gas to blow toward the internal passage of the nozzle structure through the gas flow path.

* * * * *